United States Patent [19]

Wermuth

[11] Patent Number: 4,791,385
[45] Date of Patent: Dec. 13, 1988

[54] VOLTAGE CONTROLLED AMPLIFIER FOR SYMMETRICAL ELECTRICAL SIGNALS

[75] Inventor: Jurgen Wermuth, Peine/Sted., Fed. Rep. of Germany

[73] Assignee: ANT Nachrichtentechnik GmbH, Backnang, Fed. Rep. of Germany

[21] Appl. No.: 69,537

[22] Filed: Jul. 1, 1987

[30] Foreign Application Priority Data

Jul. 5, 1986 [DE] Fed. Rep. of Germany ....... 3622615

[51] Int. Cl.[4] ............................................. H03G 3/30
[52] U.S. Cl. ................................... 330/278; 307/493; 330/282; 330/284; 330/289
[58] Field of Search ................. 330/86, 110, 145, 278, 330/282, 289, 284; 333/14; 455/72, 249; 381/106; 328/145; 307/491–493

[56] References Cited

U.S. PATENT DOCUMENTS 4,403,199  9/1983  Blackmer ...................... 328/145 X

FOREIGN PATENT DOCUMENTS 2137787  10/1984  United Kingdom .

OTHER PUBLICATIONS

Tietze, Halbleiter-Schaltungstechnik, 2nd Edition, published by Springer-Verlag, 1971, pp. 282-287.

*Primary Examiner*—James B. Mullins
*Attorney, Agent, or Firm*—Spencer & Frank

[57] ABSTRACT

To correct temperature caused changes in symmetry and gain in a voltage controlled amplifier including a logarithm circuit and an antilog circuit, an auxiliary voltage proportional to the absolute temperature is provided to control the antilog circuit; this auxiliary voltage is also contained as a factor in a voltage which controls both the logarithm and the antilog circuits.

19 Claims, 2 Drawing Sheets

PRIOR ART
FIG. 1
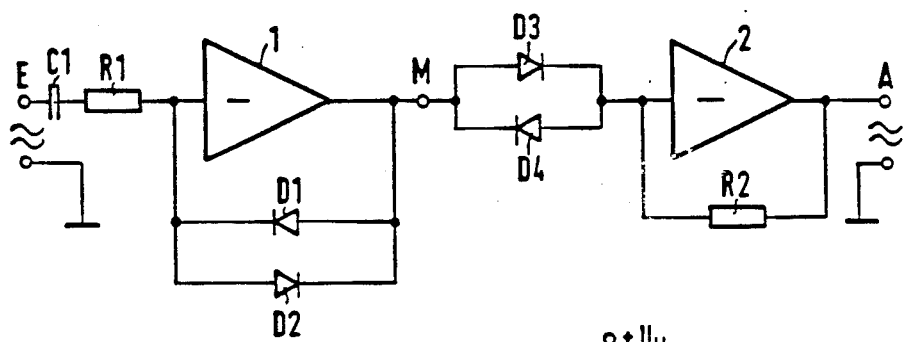
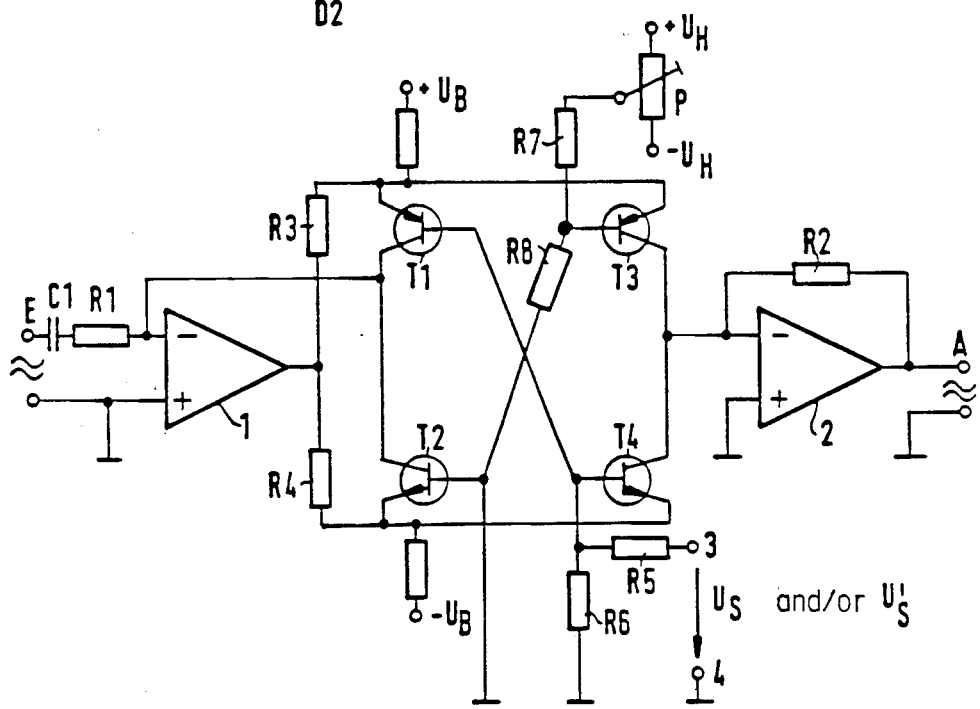
FIG. 2

VOLTAGE CONTROLLED AMPLIFIER FOR SYMMETRICAL ELECTRICAL SIGNALS

The invention relates to an amplifier for ground symetrical signals.

The best known representative of such an amplifier is the so-called VCA (voltage controlled amplifier). If it were required only for half-waves of one polarity, it could be composed of a circuit which produces an output equal to the logarithm of the input signal with a subsequently connected circuit which produces an output equal to the exponential power of its input signal, i.e., an antilog circuit, (see Tietze, Schenk, "Halbleiter-Schaltungstechnik" [Semiconductor Circuit Technology], 2nd Edition, published by Springer-Verlag, 1971, pages 282 et seq.). However, with such a circuit arrangement, care would have to be taken that the slope of the characteristic of the logarithm circuit and/or of the antilog circuit is controllable. Each one of these characteristics represents the curve of the amplifier output level as a function of the input level.

FIG. 1 is a basic circuit diagram of such an amplifier for an input signal, which may have both polarities, at its input E, with the gain of the amplifier not being controllable. Between its input terminal E and a center terminal M, the amplifier has an instantaneous compressor with an approximately logarithmic gain characteristic. The compressor is composed of an operational amplifier 1, having a series input circuit composed of a coupling capacitor C1 and an input resistor R1, and a pair of feedback diodes D1, D2 connected in antiparallel. With the output voltage of operational amplifier 1 rising linearly in magnitude, a superproportional current, i.e. an exponentially increasing current, is returned via feedback diodes D1 and D2 to the input of operational amplifier 1 so that greater amplitude values are amplified less than smaller values in the compressor.

In the subsequent antilog circuit (instantaneous expander), which is disposed between center terminal M and amplifier output terminal A, conditions are reversed. Here the currents through input diodes D3 and D4, which increase exponentially with a linearly increasing input voltage to the expander, are amplified by an operational amplifier 2 and its feedback resistance R2 and produce a correspondingly amplified output voltage across output terminal A.

To realize a controllable gain for the amplifier, the diodes of FIG. 1 are each replaced in FIG. 2 by the emitter-collector path of a respective transistor T1 to T4. In such an emitter-collector path, the current through the transistor also rises exponentially with the linearly increasing emitter-base voltage as long as the associated base-collector voltage remains constant. If a potential applied to a pair of adjustment terminals 3, 4 is initially kept constant, the potential differences between the constant base potentials, on the one hand, and the half-wave shaped, pulsating emitter potentials, on the other hand, produce collector currents that are an exponential function of the base-emitter voltages.

Controlling the gain of the amplifier is now possible in that an adjustment value (control voltage) Us may be applied to the pair of adjustment terminals 3, 4, thus permitting the slope of the collector current/base-emitter voltage characteristic of each transistor to be varied because a change in potential at the bases causes a chage in the collector-base voltage. It must here be considered that the potential at the collectors is almost zero because the collectors are each connected with one of the inverted inputs (so-called virtual zero points) of the respective operational amplifiers 1 and 2. In detail, the gain control operates such that, for example, an increase in potential applied to adjustment terminals 3, 4 adjusts transistor T4 to conduct better and transistor T1 to conduct less well, with the result that the degree of expansion in the expander (2, R2, T3, T4) increases and the degree of compression occurring in the compressor (1, R1, T1, T2) decreases, so that the overall gain between input terminals E and output terminal A increases.

If an amplifier according to FIG. 2, or another amplifier for symmetrical signals including a logarithm circuit and an antilog circuit, is employed over a wide temperature range, undesirable temperature dependent signal components may occur at the output.

SUMMARY OF THE INVENTION

It is, therefore, the object of the present invention to provide an amplifier of the above type wherein undesirable temperature dependent signal components, which may occur at the output thereof, are substantially eliminated.

The above object is accomplished in accordance with the present invention by providing an auxiliary circuit which functions to generate an auxiliary voltage proportional to absolute temperature. The auxiliary voltage is applied to the antilog circuit of the amplifier while a gain control voltage which may contain the auxiliary voltage as a factor is applied to both the logarithm and antilog circuits.

BRIEF DESCRIPTION OF THE DRAWING

FIG. 1 is a circuit diagram of a voltage controlled amplifier according to the prior art having a logarithm circuit and an antilog circuit but without controllable gain.

FIG. 2 is a circuit diagram of a voltage controlled amplifier having logarithm and antilog circuits wherein means are provided to supply a gain control voltage and a temperature compensating auxiliary voltage to the logarithm and antilog circuits.

DESCRIPTION OF THE PREFERRED EMBODIMENTS

The operation of the invention and of embodiments thereof will be described in greater detail with reference to FIGS. 2 to 9.

FIGS. 1 and 2 have already been substantially described; FIGS. 3 to 8 show ways of generating an auxiliary voltage $U_H$ as it is required for the amplifier of FIG. 2.

Figure 9:
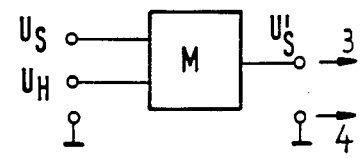
FIG. 9 illustrates in block diagram form a variation of the invention operable to provide a substitute control voltage, including the auxiliary voltage as a component.

FIG. 9 shows a way to generate a substitute control voltage which can be used in a variation of the invention in connection with FIG. 2.

In the embodiment according to FIG. 2, a coupling capacitor C1 takes care that the signal to be processed reaches operational amplifier 1 with an arithmetic mean value of zero. Resistor R1 and feedback resistors R3, R4 determine the gain of operational amplifier 1 in a known manner. The amplifier is fed by operating voltages $+U_B$ and $-U_B$ measured with respect to ground potential. Control voltage $U_S$ is coupled from control terminals 3 and 4 via a voltage divider R5, R6 to the bases of transistors T1 and T4. By way of decoupling resistors R7 and R8, the bases of the other two transistors T2 and T3 are biased by a potentiometer P. If the potential at these bases is increased, the positive half wave of the ground symmetrical signal is amplified less by transistor T3 while the negative half wave through transistor T2 is amplified more. Thus, potentiometer P is able to influence the ground symmetry of the signals at output A which have been amplified by the illustrated amplifier.

Once the ground symmetry has been set by potentiometer P, it should actually remain the same. However, it has been found in practice that, particularly if the illustrated amplifier is employed over a large temperature range of, for example, ±30° C. or even ±50° C., the output voltage across output A exhibits temperature dependent interference components. The interference may be manifested in that the ground symmetry is interfered with or in that the gain is influenced by the temperature.

The present invention is based on the realization that these interferences can be substantially eliminated over a wide temperature range with the aid of an auxiliary voltage $U_H$. The auxiliary voltage is distinguished by the fact that it is proportional to the absolute temperature.

To improve the temperature dependency of the ground symmetry, the auxiliary voltage is fed to the base of transistor T3 and, after being attenuated by a series resistor R8, also to the base of transistor T2, after it has been divided in potentiometer P. For the temperature compensating effect, the proportionality of the auxiliary voltage with respect to the absolute temperature is the deciding factor while for the one-time setting of the symmetry with the aid of potentiometer P, it is the magnitude of the auxiliary voltage as divided by the potentiometer which is the deciding factor.

To reduce undesirable influences of the temperature on the degree of amplification of the amplifier shown in FIG. 2, control terminals 3 and 4 may receive, instead of control voltage $U_S$, a substitute control voltage $U'_S$ which is formed of the product of control voltage $U_S$ and auxiliary voltage $U_H$. Again, only the temperature dependence of the auxiliary voltage is decisive for an improvement in the temperature dependence of the gain while its magnitude is significant for the basic setting of the gain.

FIGS. 3 to 8 now represent circuit diagrams for the generation of the auxiliary voltage $U_H$.

Figure 3:
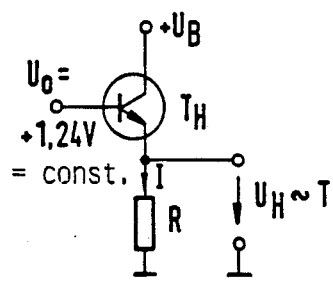
FIG. 3 is a circuit diagram of an auxiliary transistor circuit according to the invention wherein the auxiliary voltage is derived from a resistor in the emitter input lead.
Figure 4:
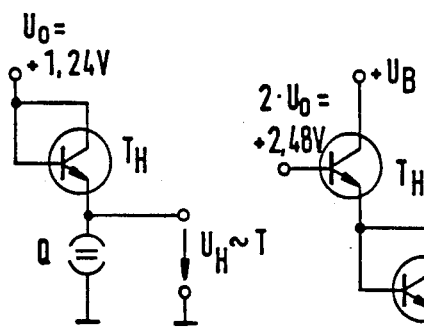
FIG. 4 shows a circuit, similar to that of FIG. 3, but wherein the auxiliary voltage is derived from a constant current source.

FIGS. 3 and 4 each show an auxiliary transistor $T_H$ whose collector is connected to a constant operating voltage $U_B$, i.e. +1.24V. A resistor R (FIG. 3) and a constant current source Q (FIG. 4), are respectively provided in the emitter input lead of transistor $T_H$, while the base thereof is connected to a constant bias $U_O$ of approximately +1.24V. This temperature stabilized direct voltage $U_O$ is calculated according to the following formula: $U_O = U_{beO} + \alpha \cdot 273°/mV$ where UbeO = the base-emitter voltage across the auxiliary transistor base-emitter junction (p/n or n/p) junction at 0° C. and with operating collector and emitter current;

$\alpha$ = the temperature coefficient of this base-emitter voltage.

With this value for the base-ground voltage $U_O$, the emitter current I (which is approximately equal to the collector current) is directly proportional to the absolute temperature so that the auxiliary voltage $U_H$ dropping across resistor R and constant current source Q, respectively, is also directly proportional to the absolute temperature. The almost ideal conditions realizable by constant current source Q of FIG. 4, are attained almost as well if the resistor R of FIG. 3 is employed, if this resistance is greater by a power of ten or more than the internal emitter resistance of auxiliary transistor $T_H$, which, in a proven case, had a value of 25 Ohm at 25° C. and an emitter current of 1 mA. In this case, resistor R would thus have a value of, for example, 500 Ohm or 0.5 kOhm.

Figure 5:
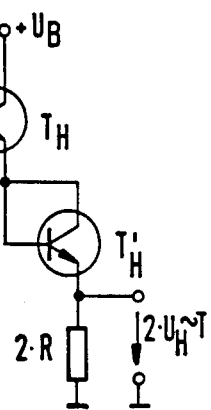
FIG. 5 is a circuit diagram, generally similar to FIG. 3, wherein an additional auxiliary transistor is included to provide an auxiliary voltage of double value.

With the circuit according to FIG. 5 and with the aid of an additional auxiliary transistor $T'_H$ it is possible to generate an auxiliary voltage $2 \cdot U_H$, which is twice as high as the auxiliary voltage $U_H$ of FIGS. 3 and 4. For this purpose, the base of auxiliary transistor $T_H$ must receive twice the voltage, $2 \cdot U_O$, i.e. approximately 2.48V.

Figure 6:
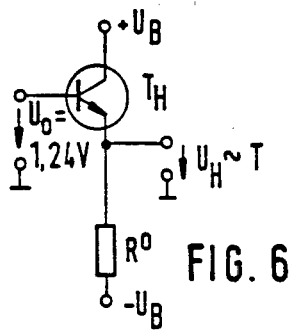
FIG. 6 is a circuit diagram, similar to FIG. 3, wherein positive and negative operating voltages are respectively applied to the collector and emitter of the auxiliary transistor.

In the embodiment of FIG. 6, the emitter input lead is conducted from a negative operating voltage $-U_B$ via a resistor R° to the emitter of auxiliary transistor $T_H$. The advantage of this circuit is that resistor R° can be selected to be relatively large even if the operating voltages $+U_B$ and $-U_B$ are relatively small so that the ideal conditions of FIG. 4 are approached where constant current source Q, with its infinitely large internal resistance, is not influenced by the internal emitter resistance of auxiliary transistor $T_H$.

Figure 7:
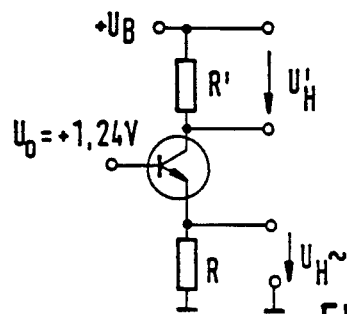
FIG. 7 is a circuit diagram, similar to FIG. 3, wherein auxiliary voltages are respectively derived from emitter and collector resistors of equal value.

In FIG. 7, the fact is utilized that the collector current is almost as large as the emitter current. If the emitter resistance R is equal to the collector resistance R', the two auxiliary voltages $U_H$ and $U'_H$ are also both approximately equal to one another.

The auxiliary voltages $+U_H$ generated with the circuit arrangements according to FIGS. 3 to 7 can be used directly in FIG. 2. The negative auxiliary voltage $-U_H$ requires corresponding circuits with reversed polarities for the voltages and transistors of the other polarity.

Figure 8:
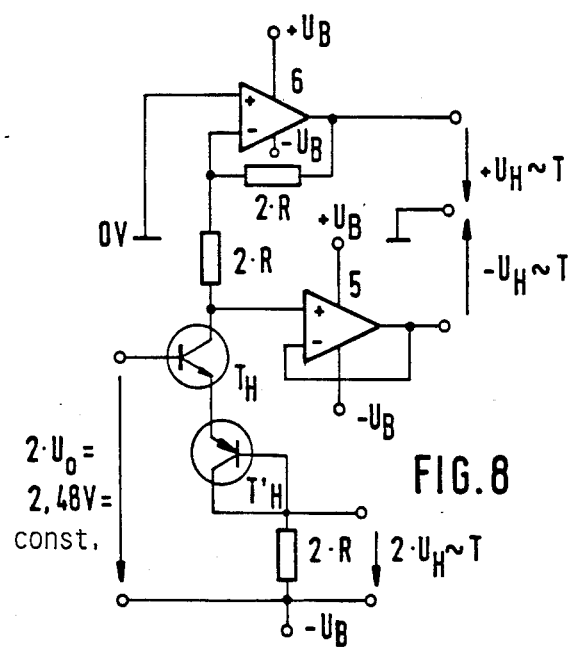
FIG. 8 is a circuit diagram, including features illustrated in FIGS. 5 and 7, which provides positive and negative auxiliary voltages, as well as an auxiliary voltage of double value.

FIG. 8 shows how a single circuit can be used to generate a positive as well as a negative auxiliary voltage. In part this circuit corresponds to that of FIG. 5 but, as in FIG. 7, a voltage drop produced by the collector current is utilized to generate the auxiliary voltages. The voltage between the collector of auxiliary transistor $T_H$ and ground potential (0V) is amplified to $-U_H$ by an operational amplifier 5, while the same collector voltage is processed by a phase-inverter amplifier 6 to yield $+U_H$.

To substantially avoid temperature dependent changes in the gain of the circuit arrangement according to FIG. 2, the circuit arrangement of FIG. 9 may be connected to control terminals 3 and 4 so that instead of control voltage $U_S$, control terminals 3 and 4 are now fed the substitute control voltage $U'_S$. The latter is provided, according to FIG. 9, by a multiplier M which receives control voltage $U_S$ and auxiliary voltage $U_H$ for multiplication.

The best temperature independence of the circuit of FIG. 2 is realized if it receives the auxiliary voltage $U_H$ via potentiometer P as well as via the circuit arrangement of FIG. 9, with this auxiliary voltage $U_H$ being proportional to the absolute temperature.

It should be noted that a circuit 5 similar to FIG. 3, likewise for the temperature compensation of an amplifier stage, has already been disclosed (FRG-AS No. 2,059,148). The collector-emitter path of the auxiliary transistor $T_H$, is therein disposed in the emitter input lead of an amplifying transistor and the collector current of the auxiliary transistor $T_H$, which is proportionally dependent on the absolute temperature, is intended to reduce the temperature dependence of the gain of the amplifying transistor. This prior art circuit arrangement cannot simply be transferred to the voltage controlled, ground symmetrical amplifier of FIG. 2. The present invention finds another way to compensate temperature dependent output signal components.

For bipolar silicon transistors the direct voltage $U_O$ which is applied in FIGS. 3, 4, 6 and 7 to the base of auxiliary transistor $T_H$ has an approximately value of 1.24V. For germanium transistors, for example, another value results for $U_O$. It should be temperature stabilized. Moreover, the circuits shown in FIGS. 3 to 8, particularly the transistors contained therein, should be temperature coupled with transistors T1 to T4 of FIG. 2 so that the errors produced by transistors T1 to T4 at a certain temperature can be compensated by an auxiliary voltage $U_H$ generated at the same temperature.

The invention now being fully described, it will be apparent to one of ordinary skill in the art that many changes and modifications can be made thereto without departing from the spirit or scope of the invention as set forth herein.

What is claimed:

1. A voltage controlled, ground symmetrical amplifier comprising:
    a logarithm circuit comprising a first pair of bipolar transistors and circuit means connecting the emitter-collector paths of said first pair of transistors,
    an antilog circuit comprising a second pair of bipolar transistors and circuit means connecting the emitter-collector paths of said second pair of transistors,
    means connected for applying a gain control voltage to the bases of one of said first pair of transistors and one of said second pair of transistors,
    a bipolar auxiliary transistor having an impedance in the emitter-collector path thereof,
    means connected for applying to the base of said auxiliary transistor a constant direct voltage, which is temperature stabilized over the operating range of the amplifier and whose value is approximately equal to $U_{beO}+\alpha\cdot 273°/mV$ where
    $U_{beO}$=the base-emitter voltage across the p/n or n/p junction at 0° C. and with operating collector and emitter current, and
    $\alpha$=the temperature coefficient of this base-emitter voltage, whereby the auxiliary voltage appearing across said auxiliary transistor impedance is directly proportional to absolute temperature,
    means connected for thermally coupling said auxiliary transistor to said first and second pair of transistors,
    circuit means connected for applying said auxiliary voltage to the base of the other of said second pair of transistors, whereby the output signal from said antilog circuit is ground symmetrical over at least a range of ±30°, and
    means connected for generating said gain control voltage as a product voltage containing said auxiliary voltage as a factor.

2. The amplifier of claim 1 wherein said auxiliary transistor impedance comprises a constant current source.

3. The amplifier of claim 1 wherein said auxiliary transistor impedance comprises a resistor.

4. The amplifier of claim 3 wherein said resistor has a value equal to more than a power of ten of the internal emitter resistance of said auxiliary transistor.

5. The amplifier of cliim 3 wherein said auxiliary transistor is a silicon transistor and the constant direct voltage is approximately 1.24V.

6. The amplifier of claim 3 wherein said circuit means to apply said auxiliary voltage includes a potentiometer.

7. The amplifier of claim 6 wherein there is further provided:
    means coupled to said resistor and to said potentiometer operable to provide ground symmetrical positive and negative auxiliary voltages.

8. A voltage controlled, ground symmetrical amplifier comprising:
    a logarithm circuit comprising a first pair of bipolar transistors and circuit means connecting the emitter-collector paths of said first pair of transistors,
    an antilog circuit comprising a second pair of bipolar transistors and circuit means connecting the emitter-collector paths of said second pair of transistors,
    means connected for applying a gain control voltage to the bases of one of said first pair of transistors and one of said second pair of transistors,
    a bipolar auxiliary transistor having an impedance in the emitter-collector path thereof,
    means connected for applying to the base of said auxiliary transistor a constant direct voltage, which is temperature stabilized over the operating range of the amplifier and whose value is approximately equal to $U_{beO}+\alpha\cdot 273°/mV$ where
    $U_{beO}$=the base-emitter voltage across the p/n or n/p junction at 0° C. and with operating collector and emitter current, and
    $\alpha$=the temperature coefficient of this base-emitter voltage,
    whereby the auxiliary voltage appearing across said auxiliary transistor impedance is directly proportional to absolute temperature,
    means connected for thermally coupling said auxiliary transistor to said first and second pair of transistors, and
    circuit means connected for applying said auxiliary voltage to the base of the other of said second pair of transistors, whereby the output signal from said antilog circuit is ground symmetrical over at least a range of ±30°.

9. The amplifier of claim 8 wherein said auxiliary transistor impedance comprises a constant current source.

10. The amplifier of claim 8 wherein said auxiliary transistor impedance comprises a resistor.

11. The amplifier of claim 10 wherein said resistor has a value equal to more than a power of ten of the internal emitter resistance of said auxiliary transistor.

12. The amplifier of claim 10 wherein said auxiliary transistor is a silicon transistor and the constant direct voltage is approximately 1.24V.

13. The amplifier of claim 10 wherein said circuit means to apply said auxiliary voltage includes a potentiometer.

14. The amplifier of claim 13 wherein there is further provided:
means coupled to said resistor and to said potentiometer operable to provide ground symmetrical positive and negative auxiliary voltages.

15. A voltage controlled, ground symmetrical amplifier comprising:
a logarithm circuit comprising a first pair of bipolar transistors and circuit means connecting the emitter-collector paths of said first pair of transistors,
an antilog circuit comprising a second pair of bipolar transistors and circuit means connecting the emitter-collector paths of said second pair of transistors,
means connected for applying a gain control voltage to the bases of one of said first pair of transistors and one of said second pair of transistors,
a bipolar auxiliary transistor having an impedance in the emitter-collector path thereof,
means connected for applying to the base of said auxiliary transistor a constant direct voltage, which is temperature stabilized over the operating range of the amplifier and whose value is approximately equal to $U_{beO}+\alpha \cdot 273°/mV$ where
$U_{beO}$ = the base-emitter voltage across the p/n or n/p junction at 0° C. and with operating collector and emitter current, and
$\alpha$ = the temperature coefficient of this base-emitter voltage,
whereby the auxiliary voltage appearing across said auxiliary transistor impedance is directly proportional to absolute temperature,
means connected for thermally coupling said auxiliary transistor to said first and second pair of transistors, and
means connected for generating said gain control voltage as a product voltage containing said auxiliary voltage as a factor.

16. The amplifier of claim 15 wherein said auxiliary transistor impedance comprises a constant current source.

17. The amplifier of claim 15 wherein said auxiliary transistor impedance comprises a resistor.

18. The amplifier of claim 17 wherein said resistor has a value equal to more than a power of ten of the internal emitter resistance of said auxiliary transistor.

19. The amplifier of claim 17 wherein said auxiliary transistor is a silicon transistor and the constant direct voltage is approximately 1.24V.

* * * * *